United States Patent [19]

Burton

[11] Patent Number: 4,539,744

[45] Date of Patent: Sep. 10, 1985

[54] SEMICONDUCTOR PLANARIZATION PROCESS AND STRUCTURES MADE THEREBY

[75] Inventor: Greg Burton, Mountain View, Calif.

[73] Assignee: Fairchild Camera & Instrument Corporation, Mountain View, Calif.

[21] Appl. No.: 576,665

[22] Filed: Feb. 3, 1983

[51] Int. Cl.³ .............................................. H01L 21/95
[52] U.S. Cl. ....................................... 29/580; 29/571; 29/576 W; 156/657; 156/662; 357/49
[58] Field of Search ................... 29/571, 576 W, 578, 29/580; 357/49; 156/643, 632, 662, 657; 501/63; 148/DIG. 131, DIG. 117, DIG. 85

[56] References Cited

U.S. PATENT DOCUMENTS

| 4,073,054 | 2/1978 | Kaji et al. | 29/580 |
| 4,417,914 | 11/1983 | Lehrer | 65/60.53 |

FOREIGN PATENT DOCUMENTS

| 0060783 | 9/1982 | European Pat. Off. | 501/63 |
| 0060784 | 9/1982 | European Pat. Off. | 501/63 |

OTHER PUBLICATIONS

Tenney, A. S. et al., "Etch Rates of Doped Oxides in Solutions of Buffered HF", in J. Electrochem. Soc., 120 (8), pp. 1091–1095, 8-1973.

Primary Examiner—Brian E. Hearn
Assistant Examiner—Alan E. Schiavelli
Attorney, Agent, or Firm—Carl A. Silverman

[57] ABSTRACT

A silicon substrate having a silicon dioxide bird's head is provided. A thermal oxide layer is grown on the exposed silicon surface. A layer, e.g., 4000 A°, of phosphogermanosilicate glass is deposited on the thermal oxide and on the silicon dioxide bird's head. The structure is heated to 950° C., causing a reflow of the glass which results in a planar surface. The thermal oxide and the phosphogermanosilicate glass are then wet etched at the same rate with a solution of hydrofluoric acid, ammonium fluoride, and deionized water. The wet etch is terminated when the exposed silicon surface is reached, resulting in a smooth surface as defined by the planar reflow surface. Other embodiments are disclosed.

19 Claims, 6 Drawing Figures

SEMICONDUCTOR PLANARIZATION PROCESS AND STRUCTURES MADE THEREBY

BACKGROUND OF THE INVENTION

The present invention relates generally to a planarization process, and more particularly, to such a process for use in the manufacture of semiconductor structures.

A well known technique for creating dielectrically isolated integrated circuits through the use of oxidation is disclosed in U.S. Pat. No. 3,648,125, issued Mar. 7, 1972, assigned to the assignee of the present invention and hereby incorporated by reference. This commonly employed technique is often referred to as LOCOS (Local Oxidation Of Silicon).

Although the LOCOS technique provides a simple and effective means to dielectrically isolate semiconductor integrated circuits, use of this technique typically results in a topographical surface which is non-planar. In the case of silicon semiconductor material, the resulting non-planar structure on the surface is referred to as a "bird's head". Such a non-planar surface is undesirable for high density applications where the non-planar surface is further processed to include additional structure, e.g., metallization, thereon. For example, in such high density applications, the presence of the bird's head creates problems in defining photoresist and etching of thin films in subsequent process steps.

Current techniques to planarize the bird's head typically provide a planar layer of organic material, e.g., photoresist, over the bird's head which layer is subsequently etched, along with the underlying bird's head. The etching employs a dry etch which is intended to etch both materials at the same rate. The dry etch techniques are undesirable inasmuch as they require expensive equipment and provide a low wafer throughput. In addition, the dry etch technique is difficult to apply successfully as the etch rate typically exhibits non-uniformity across the wafer surface. Also, the dry etch process requires careful control inasmuch as the underlying silicon surface is easily damaged by the dry etch.

Accordingly, a general object of the present invention is to provide an improved planarization process.

Another object of the present invention is to provide such a process which does not require the use of a dry etch.

Another object of the present invention is to provide such a process which can be easily added to a conventional semiconductor fabrication procedure.

Another object of the present invention is to provide improved semiconductor structures made by such process.

SUMMARY

In one form of the invention, I provide a method of making a semiconductor structure. The method includes the step of providing a semiconductor substrate having at least one planar surface and forming an insulating pattern adjacent the surface, with the insulating pattern including at least one portion thereof which extends outward beyond the remaining planar surface. The method includes the step of depositing a film of electrically insulating material over the surface and the portions which extend outward and the step of planarizing the film. In one form, the method includes the step of wet etching the film and the electrically insulating material at substantially the same rate and the step of terminating the etching step when a predetermined thickness of the film and the electrically insulating material have been etched, e.g., when the planar surface of the substrate is reached.

DETAILED DESCRIPTION

Figure 1:
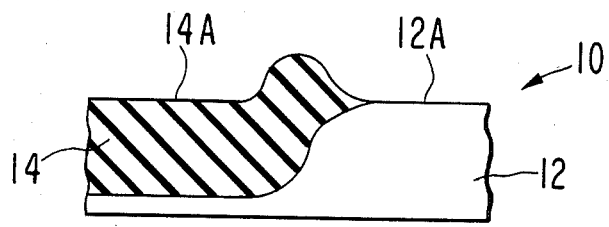
FIG. 1 is a partially sectioned elevational view of a semiconductor structure having a non-planar surface in the form of a bird's head.

Referring initially to FIG. 1, an exemplary semiconductor structure is generally designated 10. The structure 10 is in the form of a substrate and includes a portion 12 of silicon and an immediately contiguous portion 14 of silicon dioxide. The combined surfaces 12A and 14A presented by the silicon 12 and silicon dioxide 14 are non-planar, with the silicon dioxide 14 in the form of the well known "bird's head".

Figure 2:
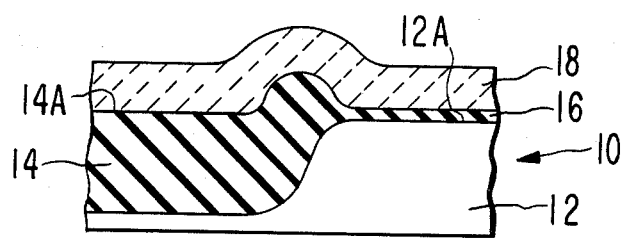
FIGS. 2–4 are elevational views, taken as in FIG. 1, showing the structure of FIG. 1 as it is processed in accordance with one form of the method of the present invention.

Referring now to FIG. 2, in one form of the method of the present invention, a relatively thin, e.g., 1000 Å, film 16 of thermal oxide is preferably first grown on the exposed silicon surface 12A. Next, a layer 18 of electrically insulating material, such as a germanosilicate glass, is deposited on the film 16 and on the silicon dioxide surface 14A. A preferred germanosilicate glass comprises 54% $SiO_2$, 42% $GeO_2$, and 4% $P_2O_5$ (hereinafter PVX-II). Glass composition, as used in this Application, is expressed as a mole percentage. Typically, the layer 18 has a thickness in the range of from about 3000 Å to about 5000 Å. Further information on suitable germanosilicate glasses can be found in U.S. application Ser. No. 362,322, entitled "Smooth Glass Insulating Film Over Interconnects On An Integrated Circuit", filed Mar. 26, 1982, now U.S. Pat. No. 4,490,737, and assigned to the assignee of the present invention.

Figure 3:
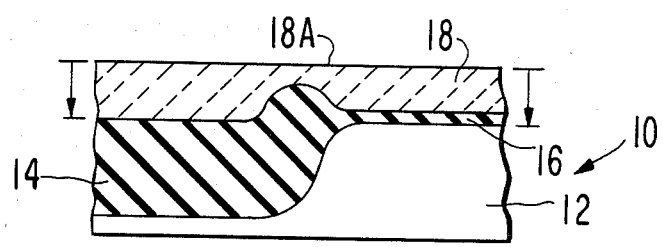

Next, as shown in FIG. 3, the layer 18 of electrically insulating material is planarized. In the case of germanosilicate glass, this planarizing step is conveniently performed through reflow thereof initiated by heat treatment. Typically, heat treatment in the range of from about 850° C. to about 1100° C. for a time period of about 30 minutes provides a satisfactory planar surface 18A.

Figure 4:
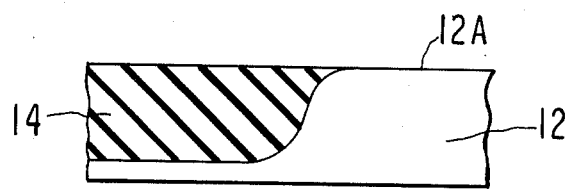

Next, as shown in FIGS. 3–4, the layer 18 of electrically insulating material and the bird's head portion 14 are wet etched in an etch solution such that the etch rate of the insulating material 18 and the bird's head portion 14 are substantially the same. This wet etching is shown schematically in FIG. 3 through the use of horizontal dashed lines. It is to be appreciated that the resulting surface, after etching, reproduces the same degree of planarity as the layer 18, subsequent to its planarization. In one form of the invention this wet etching step is terminated when the silicon surface 12A is again exposed, as shown in FIG. 4.

When using germanosilicate glass for the insulating layer 18 in the form of PVX-II, a preferable wet etch solution comprises 11.8% hydrofluoric acid (49% solution), 45.4% ammonium fluoride (40% solution), and 42.7% deionized water, with the etchant maintained from about 15° C. to about 30° C., preferably at about 20° C. Wet etch composition, as used in this Application, is expressed as a volume percentage. This wet etch solution attacks the silicon dioxide 14 and PVX-II at the rate of about 1000 Å/minute.

Figure 5:
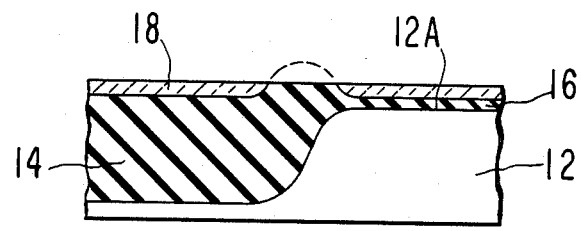
FIGS. 5 and 6 are elevational views, taken as in FIG. 1, showing other forms of the method of the present invention in which a predetermined degree of planarity is achieved.

In another form of the invention, the previously described wet etching step may be terminated prior to reaching the silicon surface 12A. For example, as shown in FIG. 5, the wet etching step may be terminated when a predetermined thickness of the bird's head 14 has been etched. The remaining PVX-II layer 18 may then be conveniently and selectively removed from the silicon surface 12A by exposing the structure to a weak hydrofluoric acid solution e.g., 10:1 ratio, such that the PVX-II etch rate is substantially faster than the thermal oxide etch rate. The remaining oxide layer 16 can then be removed by conventional wet etch techniques. This form of the invention may be desired in order to reduce the possibility of exposing the silicon sidewall through over etching of the thermal oxide.

Figure 6:
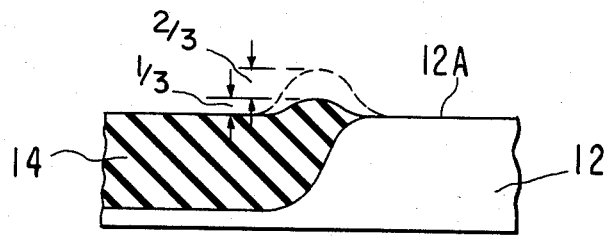

In still another form of the invention, the relative etch rates of the PVX-II and thermal oxide films can be varied to provide a desired result. Such variation is conveniently accomplished by changing the composition of the wet etching solution. In this connection, in general, as the hydrofluoric acid concentration is decreased, the PVX-II etch rate becomes significantly faster than the thermal oxide etch rate. Thus, the selection of the wet etch composition can be used to provide various degrees of planarization. For example, as shown in FIG. 6, one application may require that only two thirds (2/3) of the bird's head 14 is to be removed. For such an application, the composition of the wet etch solution would be chosen to etch PVX-II at a rate which is three-halves (3/2) greater than that of the thermal oxide.

Of course, the method of the present invention is not limited to the specific materials discussed above. For example, further information on suitable germanosilicate glasses can be found in U.S. application Ser. No. 362,322, entitled "Smooth Glass Insulating Film Over Interconnects On An Integrated Circuit", filed Mar. 26, 1982, and assigned to the assignee of the present invention. In this connection, preferable germanosilicate glasses include those having: $SiO_2$ in the range of from about 5% to about 80%; $GeO_2$ in the range of from about 10% to about 100%; and $P_2O_5$ in the range of from about 0% to about 10%.

Similarly, the invention is not limited to the hydrofluoric wet etch solution discussed above. In this connection, preferable hydrofluoric etch solutions include those having: hydrofluoric acid in the range of from about 3% to about 30%; ammonium fluoride in the range of from about 10% to about 95%; and deionized water in the range of from about 0% to about 90%.

Further, the method of the present invention is not limited to the use of planarizing germanosilicate glass in combination with a silicon dioxide bird's head. Indeed, the present invention is generally applicable to any semiconductor fabrication in which a non-planar surface is presented by at least two different materials and in which it is desirable to planarize the non-planar surface. Thus, in multilevel semiconductor structures, the method of the present invention can be repeated at some or all of the various levels. Similarly, the non-planar surface need not be in the form of a bird's head, as in the case of a thermally grown oxide but may, for example, be in the form of a deposited pattern such as that produced by a deposition of silicon dioxide through sputtering or chemical vapor deposition.

Use of the method of the present invention requires little additional expense in the fabrication of semiconductors inasmuch as the preferred phosphogermosilicate glass is formed by low temperature, e.g., 430° C.; deposition at atmospheric pressure while the planarizing heat treatment and the wet etch are routine semiconductor fabrication procedures. Further, the semiconductor structure, e.g., wafer, throughput is high inasmuch as the steps involved in the method can be easily performed simultaneously, i.e., batch processed, on a plurality of wafers. The method does not require a higher degree of operator skill inasmuch as the individual steps involved are essentially classical fabrication procedures.

Semiconductor structures made by the method of the present invention present a uniform result across a wafer surface particularly because the planarizing layer e.g., PVX-II, is relatively thin, e.g., 4000 Å while the wet etch process displays acceptable uniformity, e.g., +2%, across a wafer. Also, referring to FIGS. 4–6, the integrity of the silicon surface 12A is preserved inasmuch as the wet etch solution is selected to be non-reactive with silicon.

While the present invention has been described with reference to specific embodiments thereof, it will be obvious to those skilled in the art that various changes and modifications may be made without departing from the invention in its broader aspects. It is contemplated in the appended claims to cover all such variations and modifications of the invention which come within the true spirit and scope of the invention.

What is claimed as new and desired to be secured by Letters Patent of the United States is:

1. A method of making a semiconductor structure, comprising the steps of:
    (a) providing a semiconductor substrate having at least one substantially planar surface, said substrate comprising silicon,
    (b) forming an electrically insulating pattern adjacent said surface, said insulating pattern comprising silicon dioxide and including at least one portion thereof which extends outward beyond and away from said remaining planar surface,
    (c) depositing a film of electrically insulating material over said surface and said portions, said material comprising germanosilicate glass,
    (d) planarizing said film of step (c),
    (e) wet etching said film of step (c) and said electrically insulating pattern of step (b) at substantially the same rate, and
    (f) terminating the etching step when a predetermined thickness of said film of step (c) and said electrically insulating pattern of step (b) have been etched.

2. A method in accordance with claim 1 in which step (b) comprises oxidizing said surface of said substrate.

3. A method in accordance with claim 2 which comprises forming an oxide film on said remaining planar surface between steps b and c.

4. A method in accordance with claim 2 in which said glass includes $P_2O_5$.

5. A method in accordance with claim 4 in which said glass comprises $SiO_2$ in the range of from about 5% to about 80%, $GeO_2$ in the range of from about 10% to about 100% and P$_2$O$_5$ in the range of from about 0% to about 10%.

6. A method in accordance with claim 2 in which step (d) comprises heating said glass to cause a reflow thereof and provide a planar surface.

7. A method in accordance with claim 6 which comprises heating said glass in the range of from about 850° C. to about 1100° C.

8. A method in accordance with claim 6 in which step (e) comprises wet etching with an etchant which does not react with silicon.

9. A method in accordance with claim 9 in which the step of wet etching utilizes an etchant which comprises hydrofluoric acid, ammonium fluoride, and deionized water.

10. A method in accordance with claim 10 in which said etchant comprises hydrofluoric acid in the range of from about 3% to about 30%, ammonium fluoride in the range of from about 10% to about 95%, and deionized water in the range of from about 0% to about 90%.

11. A method in accordance with claim 10 in which said etchant is maintained at a temperature of from about 15° C. to about 30° C.

12. A method in accordance with claim 4 in which said glass comprises SiO$_2$ in the range of from about 5% to about 80%.

13. A method in accordance with claim 4 in which said glass comprises GeO$_2$ in the range of from about 10% to 100%.

14. A method in accordance with claim 4 in which said glass comprises P$_2$O$_5$ in the range of from about 0% to about 10%.

15. A method in accordance with claim 1 in which step (f) comprises terminating the etching step when said planar surface of the substrate is reached.

16. A method of making a semiconductor structure, comprising the steps of:
(a) providing a semiconductor substrate having at least one substantially planar surface, said substrate comprising silicon,
(b) forming an electrically insulating pattern adjacent said surface, said insulating pattern comprising silicon dioxide and including at least one portion thereof which extends outward beyond and away from said remaining planar surface,
(c) depositing a film of electrically insulating material over said surface and said portions, said material comprising germanosilicate glass,
(d) planarizing said film of step (c),
(e) wet etching said film of step (c) and said electrically insulating pattern of step (b) at predetermined different rates, and
(f) terminating the etching step when a predetermined thickness of said film of step (c) and said electrically insulating pattern of step (b) have been etched.

17. A method in accordance with claim 16 in which step (f) comprises terminating the etching step prior to reaching said planar surface of the substrate.

18. A method in accordance with claim 1 in which said one portion comprises a bird's head.

19. A method of making a semiconductor structure, comprising the steps of:
(a) providing a semiconductor substrate having at least one substantially planar surface, said substrate comprising silicon,
(b) forming an electrically insulating pattern adjacent said surface, said insulating pattern comprising silicon dioxide and including at least one portion thereof which extends outward beyond and away from said remaining planar surface,
(c) depositing a film of electrically insulating material over said surface, and said portions, said material comprising germanosilicate glass,
(d) planarizing said film of step (c)
(e) wet etching said film of step (c) and said electrically insulating pattern of step (b), and
(f) terminating the etching step when a predetermined thickness of said film of step (c) and said electrically insulating pattern of step (b) have been etched.

* * * * *